United States Patent [19]

Kusnick

[11] Patent Number: 5,892,470
[45] Date of Patent: Apr. 6, 1999

[54] METHOD AND SYSTEM FOR MNEMONIC ENCODING OF NUMBERS

[75] Inventor: Gregory P. Kusnick, Seattle, Wash.

[73] Assignee: Microsoft Corporation, Redmond, Wash.

[21] Appl. No.: 780,580

[22] Filed: Jan. 8, 1997

[51] Int. Cl.$^6$ .................................................. H03M 7/00
[52] U.S. Cl. ............................................................ 341/106
[58] Field of Search ................................. 341/106, 107; 379/93.18, 52, 76, 88

[56] References Cited

U.S. PATENT DOCUMENTS 4,650,927  3/1987  James ................................. 379/93.18

*Primary Examiner*—Brian Young
*Attorney, Agent, or Firm*—Seed and Berry LLP

[57] ABSTRACT

A computer-based method and system for encoding a number as a sequence of words. The system has a table of words from which the words in the sequence are selected. Each word in the table has an index. To encode the number, the system first calculates an integer quotient of the number divided by a count of the words in the table and calculates a remainder of the number divided by the count of the words in the table. The system then repeats the following until the integer quotient is zero. The system selects the word in the table that is indexed by the remainder. The system then adds that word to the sequence. The system then calculates a new remainder of the integer quotient divided by the count of the words in the table and calculates a new integer quotient of the integer quotient divided by the count of the words in the table. The sequence of the words when complete represents the encoding of the number. The present invention also provides a computer-based method and system for decoding an encoding of a number to determine the number represented by the encoding. The system initializes the number to zero. The system then repeats the following for each word in the encoding. The system determines the index of the word in the table of words. The system multiplies the number by the count of words in the table. The system then adds the determined index to the number. When the process is complete, the number contains the value represented by the encoding.

29 Claims, 4 Drawing Sheets

METHOD AND SYSTEM FOR MNEMONIC ENCODING OF NUMBERS

TECHNICAL FIELD

The invention relates generally to a computer method and system for representing numbers.

BACKGROUND OF THE INVENTION

Computer systems are increasingly requiring computer users to input very large numbers in the course of using the computer system. For example, a user who is purchasing a product via the Internet may be required to enter a credit card number, which can be 16 digits in length. In general, with the increasing use of the Internet and similar networks, the need for users to input very large numbers is increasing. For example, electronic mail addresses on the Internet and encryption keys used to secure messages sent via the Internet may be represented as very large numbers. Also, computer programs may display very large numbers to help identify an error that has occurred. The user would then report the displayed number to a programmer so that the error can be corrected.

It can be, however, very difficult for users to remember very large numbers. For example, an electronic mail address of "3481.269.321" cannot be easily remembered. Moreover, it is even more difficult to remember several very large numbers. Consequently, users often write down these very large numbers rather than remembering them. The writing down of such numbers can have several disadvantages. First, the user may not have easy access to pencil and paper. Second, even if the number is written down on paper, the user may lose the paper or may not have it immediately available when it is needed. Third, the writing down of the number can compromise security. For example, the writing down of an encryption key can compromise the security of the system because an unauthorized user can then get access to the written key.

Several techniques have been developed to help users remember various large numbers so that the writing down of the numbers can be avoided. For example, certain telephone numbers have a portion represented as a word so that the telephone number can be more easily remembered. For example, the telephone number 1-800-265-5328 can be more easily remembered as 1-800-COLLECT. While such a representation provides a useful mechanism to aid a user in remembering the telephone number, very few telephone numbers can be represented by words, and even fewer by meaningful words. To generate such a telephone number, one would identify the word and then convert the word to the corresponding telephone number. A similar approach is used for assigning personal identification numbers for accessing automated teller machines. A typical personal identification number is four digits long. Rather than assigning any four-digit number as a personal identification number, a four-letter word is first selected and then converted to the corresponding digits of a numeric keypad. For example, word "SLUG" may be selected to represent the personal identification number of 7584. A person can, in general, more easily remember the word "SLUG," rather than the number 7584. Because words are easier to remember than numbers and non-word character sequences, some computer systems generate user passwords that are a sequence of words. For example, a computer system may generate a password for a user comprising the words "SLUG TUNE," which is easier to remember than the password "75848863."

Although these various schemes have been useful in helping a user remember, they each have limited applicability (e.g., meaningful, 7-letter words for telephone numbers). It would be desirable to have a general mechanism in which very large numbers could be more easily remembered by a user.

SUMMARY OF THE INVENTION

The present invention provides a computer-based method and system for encoding a number as a sequence of words. The system has a table of words from which the words in the sequence are selected. Each word in the table has an index. To encode the number, the system first calculates an integer quotient of the number divided by a count of the words in the table and calculates a remainder of the number divided by the count of the words in the table. The system then repeats the following until the integer quotient is zero. The system selects the word in the table that is indexed by the remainder. The system then adds that word to the sequence. The system then calculates a new remainder of the integer quotient divided by the count of the words in the table and calculates a new integer quotient of the integer quotient divided by the count of the words in the table. The sequence of the words when complete represents the encoding of the number.

The present invention also provides a computer-based method and system for decoding an encoding of a number to determine the number represented by the encoding. The system initializes the number to zero. The system then repeats the following for each word in the encoding. The system determines the index of the word in the table of words. The system multiplies the number by the count of words in the table. The system then adds the determined index to the number. When the process is complete, the number contains the value represented by the encoding.

DETAILED DESCRIPTION OF THE INVENTION

Figure 1:
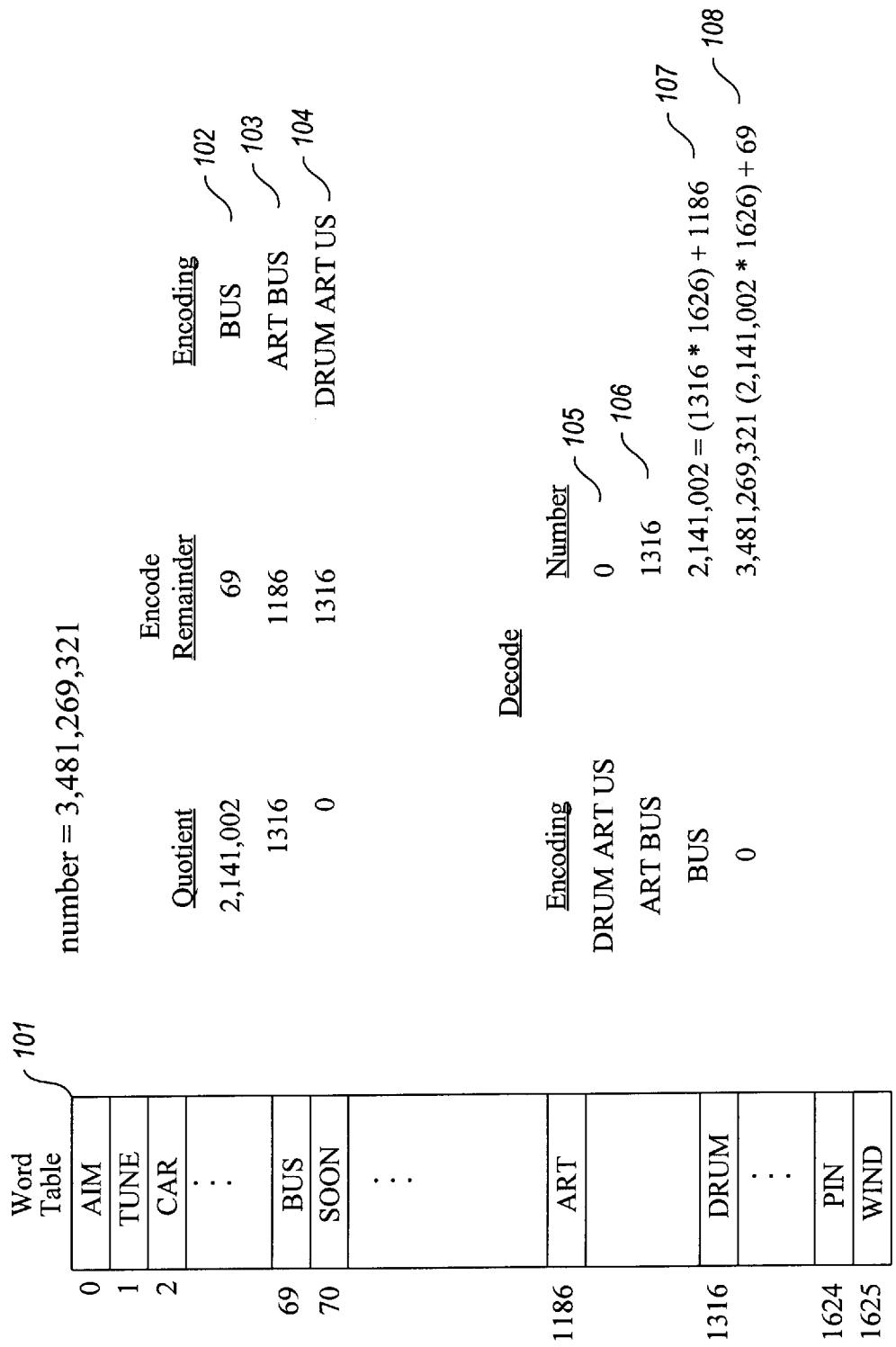
FIG. 1 is a diagram illustrating the mnemonic encoding and decoding of a number.

The present invention provides a method and system for mnemonically encoding very large numbers as a sequence of words. In one embodiment, the mnemonic encoding ("ME") system represents each number as a unique sequence of words. The ME system encodes a number by converting the number to its unique sequence of words and decodes a sequence of words by converting the sequence to its unique number. For example, the number 3,481,269,321 may be represented by the sequence of words "DRUM ART BUS." A person can, in general, more easily remember the sequence of words "DRUM ART BUS." When a computer system is to provide a number, such as an encryption key, to a user, the computer system invokes the ME system to generate the mnemonic encoding for the number. The computer system then provides this mnemonic encoding to the user, rather than the number. Whenever the user is requested to specify the number, such as the encryption key, the user specifies the mnemonic encoding. The computer system invokes the ME system to convert that mnemonic encoding to the corresponding number, which can then be used by the computer system.

To encode and decode the numbers, the ME system uses a table of, preferably, monosyllabic words. To encode a number, the ME system uses the number to identify a unique sequence of words from the table. Conversely, to decode a sequence of words, the ME system uses the words of the sequence and the table to identify the represented number. To encode a number, the ME system successively divides the number by the count of the words in the table and uses the remainder as an index into the table. The number is represented by the sequence of the words indexed by the remainders. Conversely, to decode a sequence of words, the ME system determines the index into the table for each word of the sequence and combines the indices to form the number.

The count of the words in the table can be considered to be the radix of a numbering system, and each word of the table can be considered to be a digit of that numbering system. Thus, the mnemonic encoding can be considered a representation of a number in a numbering system with a radix equal to the count of words in the table. To generate a mnemonic encoding for a number, the ME system successively divides that number by the radix to generate an integer quotient and a remainder. The integer quotient is the integer value of the quotient. For example, if the quotient is 28.62, then the integer quotient is 28. The remainder is used as an index into the table to select the word (i.e., digit) for the mnemonic encoding. The integer quotient is then again divided by the radix to give a new integer quotient and a remainder. That remainder is used again as an index into the table to select the next word. This process is repeated until the integer quotient is zero. The number is encoded as the sequence of the selected words. A mnemonic encoding is decoded in a reverse manner. To decode a mnemonic encoding, the ME system selects the highest-order word of the sequence (e.g, the last word selected for the sequence) and determines the index in the table of that word. The ME system initializes a resultant number to the value of that index. Then, for each other word in the sequence, the ME system determines the index of the word. The ME system then sets the new value of the resultant number to the sum of the determined index and of the old value of the resultant number times the radix. This process is repeated for each word in the mnemonic encoding. The value of the resultant number is the number represented by the mnemonic encoding.

FIG. 1 is a diagram illustrating the mnemonic encoding and decoding of a number. In this example, the number is 3,481,269,321. The table of words contains 1626 words, which are indexed from 0 to 1625. To encode this number, the ME system divides the number by the radix, 1626, which yields an integer quotient of 2,141,002 and a remainder of 69 (line 102). The ME system then uses the remainder as an index into the table and retrieves the indexed word, which is "BUS." The system sets the mnemonic encoding to that indexed word. The ME system then divides the integer quotient by the radix, 1626, which yields a new integer quotient of 1316 and a remainder of 1186 (line 103). The ME system then uses the remainder 1186 as an index into the table and retrieves the indexed word, which is "ART." The ME system then adds the word as the left-most word of the mnemonic encoding, which is now "ART BUS." The ME system then divides the integer quotient by the radix 1626, which yields a new integer quotient of 0 and a remainder of 1316 (line 104). The ME system uses the remainder 1316 as an index into the table and retrieves the indexed word, which is "DRUM." The ME system then adds the word "DRUM" as the left-most word of the mnemonic encoding, which is now "DRUM ART BUS." Since the integer quotient is zero, the encoding is complete. To decode the mnemonic encoding of "DRUM ART BUS," the ME system initializes the number that is represented by the mnemonic encoding to zero (line 105). The ME system then removes the left-most word from the encoding, which is "DRUM." The ME system then determines the index for that word in the table. Since the index of that word is 1316, the ME system sets the resultant number to the value 1316 (line 106). The ME system then again removes the left-most word of the current encoding, which is "ART." The ME system then determines the index for that word in the table, which is 1186. The ME system then sets the value of the resultant number to 2,141,002, which is the sum of the index (1186) and of the resultant number (1316) times the radix (1626) (line 107). The ME system then removes the left-most word from the encoding, which is "BUS." The ME system then determines the index of that word in the table, which is 69 (line 108). The ME system then sets the resultant number to 3,481,269,321, which is the sum of the index (69) and of the resultant number (2,141,002) times the radix (1626). Since the encoding is now empty, the current value of the resultant number represents the number for the mnemonic encoding. Each word in the mnemonic encoding corresponds to a radix position in the numbering system. For example, the mnemonic encoding "DRUM ART BUS," which has indices 1316, 1186, and 69, respectively, represents the number that is the result of $1316 * 1626^2 + 1186 * 1626^1 + 69 * 1626^0$.

Figure 2:
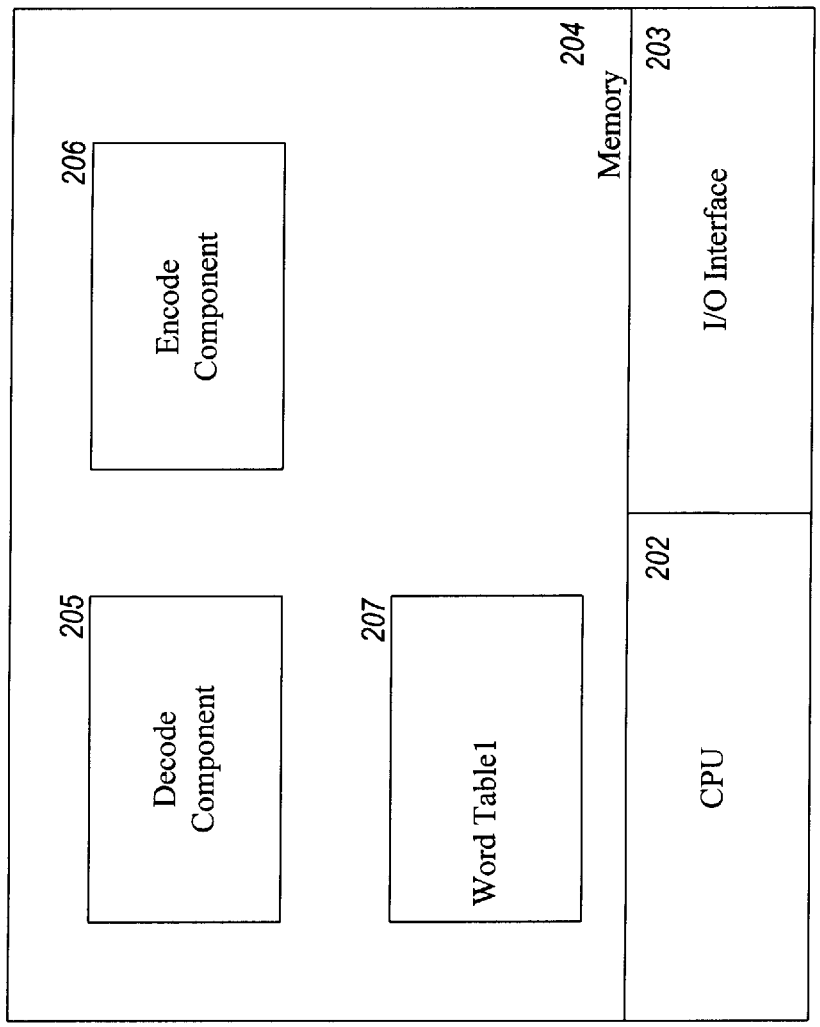
FIG. 2 is a block diagram of a computer system for practicing the present invention.

FIG. 2 is a block diagram of a computer system for practicing the present invention. The computer system 201 comprises a central processing unit 202, an I/O interface 203, and a memory 204. The memory contains a decode component 205, an encode component 206, and a word table 207. The encode component controls the encoding of a number into its mnemonic encoding. The decode component controls the decoding of the mnemonic encoding into its number. The word table 207 contains a list of the words that are used in the mnemonic encoding. In one embodiment, the encode and decode components are implemented as routines within a computer system. The computer system provides mnemonic encoding to a user via the I/O interface and receives mnemonic encodings from the user via the I/O interface. The ME system may also be stored on other computer-readable media, such as a disk.

In general, it is easier for a user to remember mnemonic encodings that have the fewest number of words. The maximum number of words m in a sequence that is needed to represent a number n is a function of the number of words w in the table. These values are related by the following formula:

$$m = \log_w(n).$$

That is, the number of words in the sequence m that are needed to represent a number n is the logarithm to a base, which is the number of words in the table w, of the number n to be represented. Thus, by increasing the number of words in the table w, the number of words in the sequence m needed to represent a certain number n can be reduced. However, there are practical limits on the number of words that can be in the table. First, it is preferable that the words in the table are commonly used and monosyllabic. Second, the table should preferably contain no homophones. For example, the words "DRUM" and "ART" may be a good choice of words to include in the table. However, the word "BUS" may not be a good choice if its homophone "BUSS" is also in the table. Also, the word "QOPH" may not be a good choice because it is uncommon. Moreover, it would be even a worse choice if its homophone "COUGH" was also in the table. Third, the table should preferably contain no words whose normal dictionary meaning is a number. For example, the table should not contain the words "ONE," "TWO," and so on. Fourth, the count of words in the table should be much larger than the radix (e.g., 10) generally used to represent numbers.

The ME system may also be used to mnemonically encode alphanumeric sequences that can contain any combinations of letters and numbers. Some computer systems generate sequences of numbers and letters that a user needs to remember. For example, a computer system may generate a password of seven alphanumeric characters. These alphanumeric characters can be considered to be a numbering system with a radix of 36, that is, the number of digits 0–9 plus the number of letters A–Z. For example, if the letter "A" corresponds to a 0, the letter "B" corresponds to a 1, and so on, and the number "0" corresponds to a 26, the number "1" corresponds to a 27, and so on, then the string "BVUXYVV" in base 36 would represent the decimal digits 3,481,269,321. Thus, this alphanumeric sequence could be represented by the mnemonic encoding "DRUM ART BUS."

Figure 3:
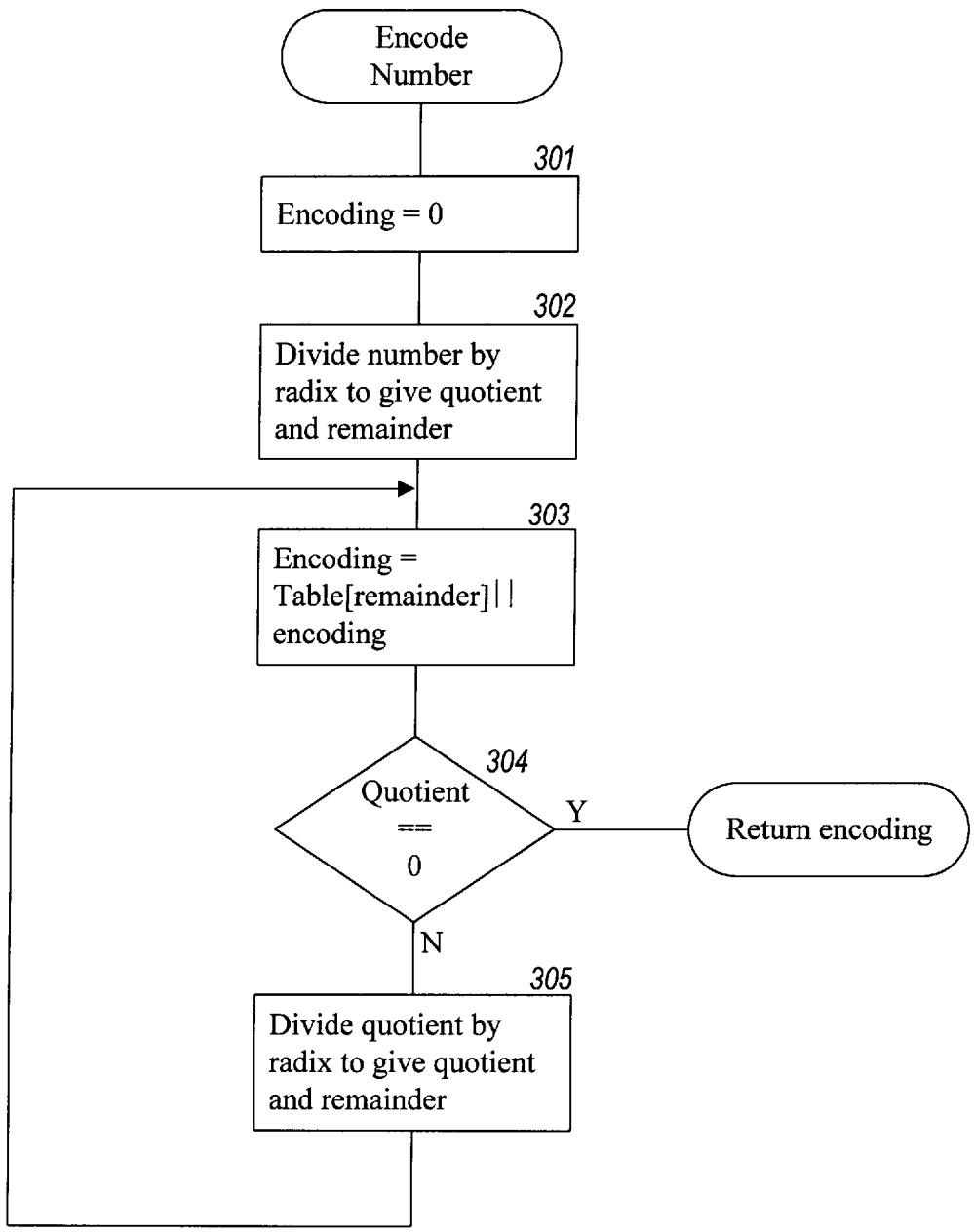
FIG. 3 is a flow diagram of an encode routine that is an implementation of the encode component.

FIG. 3 is a flow diagram of an encode routine that is an implementation of the encode component. The encode routine receives a number and returns the corresponding mnemonic encoding. In step 301, the routine sets the encoding to be empty. In step 302, the routine divides the number to be encoded by the radix (i.e., count of words in the word table) to give the integer quotient and the remainder. In step 303, the routine prefixes the current value of the encoding with the word of the table that is indexed by the remainder. In step 304, if the integer quotient is equal to zero, then the routine returns the encoding, else the routine continues at step 305. In step 305, the routine divides the current value of the integer quotient by the radix to give a new integer quotient and a new remainder, and then loops to step 303 to continue the encoding.

Figure 4:
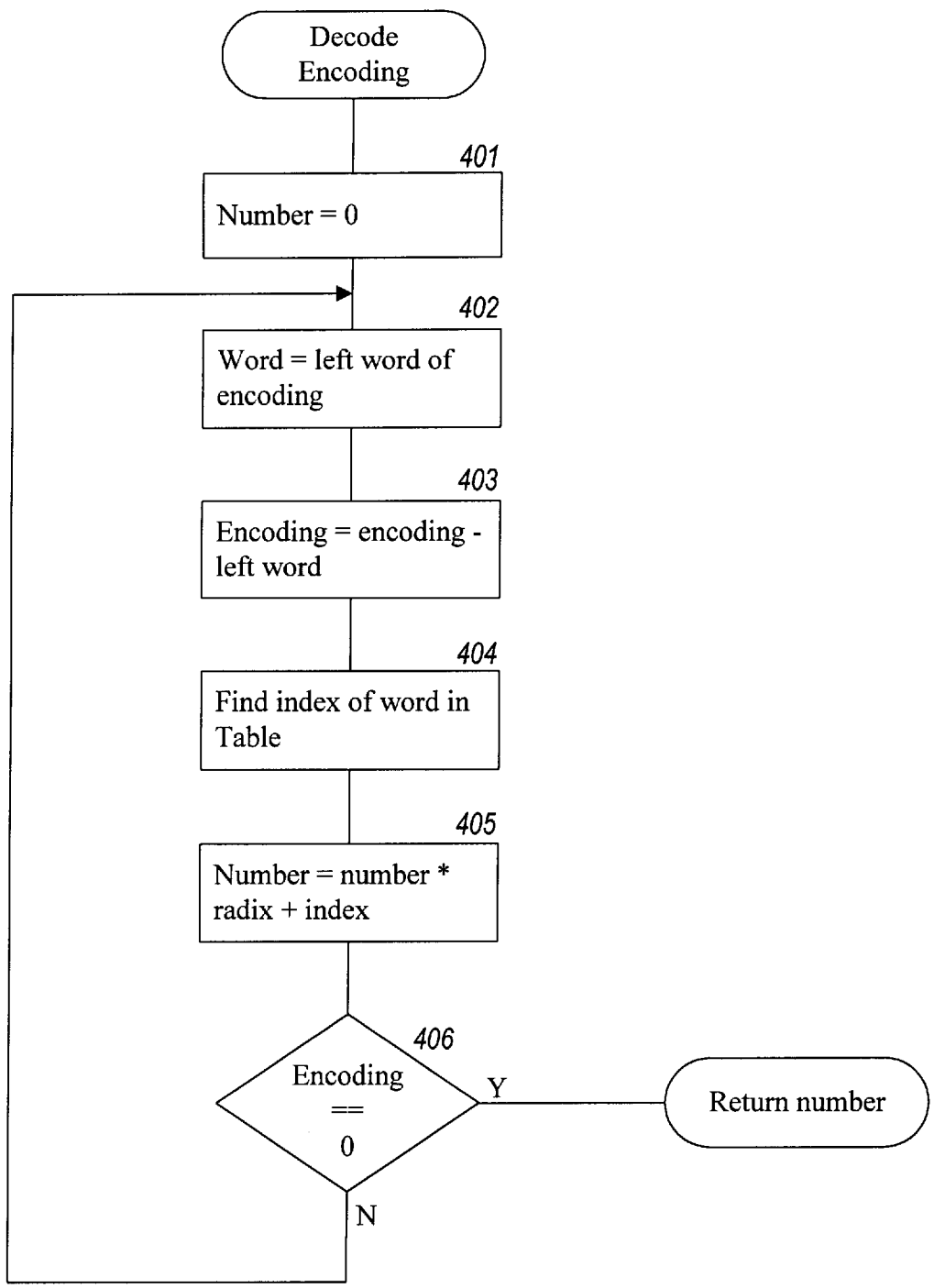
FIG. 4 is a flow diagram of a decode routine that is an implementation of the decode component.

FIG. 4 is a flow diagram of a decode routine that is an implementation of the decode component. The decode routine receives a mnemonic encoding and returns the corresponding number. In step 401, the routine initializes the number to zero. In step 402, the routine retrieves the left-most word of the mnemonic encoding. In step 403, the routine removes the left-most word from the mnemonic encoding. In step 404, the routine determines the index of that left-most word in the table. The table can be organized into various well-known techniques to facilitate searching for a word. For example, the table could be sorted alphabetically and a binary search could be performed on the table to locate the word in the table. Alternatively, the table could be organized as a hash table or as a prefix tree where each node corresponds to a letter and a leaf node indicates the index of the word spelled by the nodes from the root node to the leaf node. In step 405, the routine sets the value of the number to the current value of the number times the radix plus the index. In step 406, if the encoding is empty, then the routine returns the number, else the routine loops to step 402 to process the next word of the encoding.

As discussed above, the maximum number of words needed to represent a number is a function of the count of the words in the table. For example, if a 16-digit credit card number is to be encoded as sequence of 3 words, then the count of the words in the table would need to be 215,4441

$$\left( \text{i.e., } w = \sqrt[m]{n} \right).$$

It may be difficult, however, to identify such a large number of words for the table. If the credit card number was encoded as a sequence of 4 words, the count of the words in the table would need to be 10,000. Finally, if the credit card number was to be encoded as a sequence of 5 words, then the count of words in the table would need to be 1,585. If the count of words in the table is a power of 2, then the encoding and decoding can be performed on a digital computer by shifting rather than multiplying and dividing.

Although the ME system has been described using one table, each position of the numbering system could have its own table of digits and can even have different counts of words. For example, for a social security number, three different tables could be used: a table of 1000 words, a table of 100 words, and a table of 10000 words. Each table could be used to represent one of the three parts of a social security number. Alternatively, a table of 10,000 words could be used and only a portion of that table used to encode certain portions of the social security number. Finally, many alternative algorithms may be used for decoding and encoding so long as the algorithms provide a unique mapping from a number to a sequence of words and vice versa.

Although the present invention has been described in terms of alternate embodiments, it is not intended that the invention be limited to these embodiments. Modifications within the spirit of the invention will be apparent to those skilled in the art. The scope of the present invention is defined by the claims that follow.

I claim:

1. A method in a computer system for encoding a number as a sequence of words, the words being selected from a table of words, each word in the table having an index, the method comprising:

calculating an integer quotient of the number divided by a count of the words in the table;

calculating a remainder of the number divided by the count of the words in the table; and repeating the following until the integer quotient is zero:
selecting the word in the table that is indexed by the remainder;
adding the word to the sequence;
calculating a new remainder of the integer quotient divided by the count of the words in the table; and
calculating a new integer quotient of the integer quotient divided by the count of the words in the table.

2. A method in a computer system for decoding an encoding of a number to determine the number represented by the encoding, the encoding being a sequence of words, comprising:

receiving a table of words, each word having an index;
initializing the number to zero; and
repeating the following for each word in the encoding:
determining the index of the word in the received table;
multiplying the number by the count of words in the table; and
adding the determined index to the number.

3. A method in a computer system for representing numbers as a sequence of words, the method comprising:

selecting a plurality of words, each word representing a digit of a numbering system with a radix that is the same as the count of the selected plurality of words; and for each of the numbers, generating a representation of the number in the numbering system with the radix that is the same as the count of the words wherein each digit of the number is represented by one of the selected plurality of words.

4. The method of claim 3 wherein each of the plurality of words is monosyllabic.

5. The method of claim 3 wherein the plurality of words has no duplicate words.

6. The method of claim 3 wherein the plurality of words has no words that are homophones.

7. The method of claim 3 wherein the plurality of words are commonly used words.

8. The method of claim 3 wherein the count of words is selected so that any number to be encoded can be represented by 3 positions in a numbering system with the radix equal to the count of the words in the table.

9. The method of claim 3 wherein:

$$m = \log_w n,$$

where w represents the count of words in the table, where m represents the maximum number of words in the sequence, and where n represents the number of numbers to be encoded.

10. The method of claim 3 wherein the generating of the representation successively divides the number by the radix and uses the remainder to select a word of the sequence.

11. The method of claim 10 wherein the remainder is an index into a table containing the selected plurality of words.

12. A method in a computer system for representing alphanumeric strings as sequences of words, the method comprising:

for each alphanumeric string, assigning a unique sequence of words; and after assigning the unique sequence to each alphanumeric strings, receiving an alphanumeric string;

determining the unique sequence of words that is assigned to the received alphanumeric string; and indicating that the determined unique sequence of words represents the received alphanumeric string.

13. The method of claim 12 wherein each word is monosyllabic.

14. The method of claim 12 wherein no words in sequences are homophones.

15. The method of claim 12 wherein the words of the sequences are commonly used words.

16. A method in a computer system for providing to a user mnemonic representations of numbers, the method comprising:

for each of a plurality of numbers:

identifying a unique sequence of words that corresponds to the number; and displaying to a user that identified unique sequence of words; and for each of a plurality of sequences of words:

receiving from the user that displayed unique sequence of words; and determining the number that corresponds to that unique sequence of words whereby the user need only know the provided unique sequence of words to indicate the number and the computer system internally uses another representation of the numbers.

17. A computer-readable medium containing instructions for causing a computer system to represent numbers as a sequence of words, by:

selecting a plurality of words, each word representing a digit of a numbering system with a radix that is the same as the count of the selected plurality of words, wherein the selected words do not have a definition in standard usage that corresponds to a digit of a numbering system; and for each of the numbers, generating a representation of the number in the numbering system with the radix that is the same as the count of the words wherein each digit of the number is represented by one of the selected plurality of words.

18. The computer-readable medium of claim 17 wherein each of the plurality of words is monosyllabic.

19. The computer-readable medium of claim 17 wherein the plurality of words has no duplicate words.

20. The computer-readable medium of claim 17 wherein the plurality of words has no words that are homophones.

21. The computer-readable medium of claim 17 wherein the plurality of words are commonly used words.

22. The computer-readable medium of claim 17 wherein the count of words is selected so that any number to be encoded can be represented by 3 positions in a numbering system with the radix equal to the count of the words in the table.

23. The computer-readable medium of claim 17 wherein:

$$m = \log_w n,$$

where w represents the count of words in the table, where m represents the maximum number of words in the sequence, and where n represents the number of numbers to be encoded.

24. The computer-readable medium of claim 17 wherein the generating of the representation successively divides the number by the radix and uses the remainder to select a word of the sequence.

25. The computer-readable medium of claim 24 wherein the remainder is an index into a table containing the selected plurality of words.

26. A computer-readable medium containing instructions for causing a computer system to encode a number as a sequence of words, the words being selected from a table of words that do not correspond to digits in a standard numbering system, each word in the table having an index, by:

calculating an integer quotient of the number divided by a count of the words in the table;

calculating a remainder of the number divided by the count of the words in the table; and repeating the following until the integer quotient is zero:

selecting the word in the table that is indexed by the remainder;

adding the word to the sequence;

calculating a new remainder of the integer quotient divided by the count of the words in the table; and calculating a new integer quotient of the integer quotient divided by the count of the words in the table.

27. A computer-readable medium containing instructions for causing a computer system to decode an encoding of a number to determine the number represented by the encoding, the encoding being a sequence of words, by:

receiving a table of words that do not correspond to digits in a standard numbering system, each word having an index;

initializing the number to zero; and repeating the following for each word in the encoding:

determining the index of the word in the received table;

multiplying the number by the count of words in the table; and adding the determined index to the number.

28. A computer system for representing numbers as sequences of words, comprising:

a data structure containing a plurality of words;

an encode component that receives a number and selects a unique sequence of words from the data structure to represent the number and that displays the selected sequence to a user; and a decode component that receives from a user a sequence of words and that identifies the number represented by the received sequence.

29. The computer system of claim 28 wherein the decode component assigns a unique value to each word in the data structure and wherein the sequence of words selected is such that the number is equal to:

$$\sum_{i=0}^{m-1} v_i * w^i$$

where m represents the number of words in the sequence, v represents the value of the ith word in the sequence, and w represents the count of the words in the data structure.

* * * * *